United States Patent
Doan

(12) 
(10) Patent No.: US 6,284,660 B1
(45) Date of Patent: Sep. 4, 2001

(54) METHOD FOR IMPROVING CMP PROCESSING

(75) Inventor: Trung T. Doan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,450

(22) Filed: Sep. 2, 1999

(51) Int. Cl.$^7$ ................................................ H01L 21/461
(52) U.S. Cl. ........................ 438/692; 438/528; 438/689
(58) Field of Search .............................. 438/689, 691, 438/692, 705, 514, 528, 423, 766

(56) References Cited

U.S. PATENT DOCUMENTS

| | | |
|---|---|---|
| 4,193,226 | 3/1980 | Gill, Jr. et al. . |
| 4,811,522 | 3/1989 | Gill, Jr. . |
| 5,223,734 | 6/1993 | Lowrey et al. . |
| 5,314,843 * | 5/1994 | Yu et al. ................ 438/692 |
| 5,449,314 * | 9/1995 | Miekle et al. .......... 438/692 |
| 5,663,797 | 9/1997 | Sandhu . |
| 5,795,495 * | 8/1998 | Meikle ..................... 216/88 |
| 5,837,610 | 11/1998 | Lee et al. . |
| 5,915,175 | 6/1999 | Wise . |
| 6,008,084 * | 12/1999 | Sung ........................ 438/241 |
| 6,015,734 * | 1/2000 | Huang et al. ............ 438/253 |
| 6,030,898 * | 2/2000 | Liu ........................... 438/692 |
| 6,057,242 * | 5/2000 | Kishimoto .............. 438/692 |
| 6,066,030 * | 5/2000 | Uzoh ......................... 451/41 |
| 6,121,149 * | 9/2000 | Lukanc et al. .......... 438/692 |

OTHER PUBLICATIONS

Robert F. Pierret, Modular Series on Solid State Devices, vol. 1: Semiconductor Fundamentals, Second Edition, 1988, Addison–Wesley Publishing Company, p. 31.*

* cited by examiner

*Primary Examiner*—Matthew Smith
*Assistant Examiner*—Craig P. Lytle
(74) *Attorney, Agent, or Firm*—Dickstein Shapiro Morin & Oshinsky LLP

(57) ABSTRACT

The invention also relates to an a method of fabrication of an integrated circuit, the method includes altering a portion of a surface layer of a material to be polished and polishing the surface layer in a chemical mechanical polishing process. Preferably, the step of altering of the present invention includes adding an impurity to the material such as a dopant by heavy ion implantation at a concentration level of about $1\times10^{10}$ ions/cm$^2$ to about $1\times10^{18}$ ions/cm$^2$.

34 Claims, 6 Drawing Sheets

METHOD FOR IMPROVING CMP PROCESSING

FIELD OF THE INVENTION

The invention relates generally to the fabrication of integrated circuits, and more particularly to structures and methods for improving the polishing steps in the fabrication of integrated circuits.

DISCUSSION OF RELATED ART

Integrated circuits are produced by fabricating hundreds of identical circuit patterns on a single semiconducting wafer which is subsequently divided into identical dies or chips. It is often desirable to provide a planar topography before a subsequent layer is formed. A nonplanar topography creates problems in the patterning of subsequent layers. Such problems include, for example, limited depth of focus by the photolithographic system, metal residues during reactive ion etching, and poor metal step coverage.

A process commonly used in fabrication of integrated circuits to create a planar topography is chemical mechanical polishing (CMP). This process involves chemically etching of a surface while also mechanically grinding or polishing it. The combined action of surface chemical reaction and mechanical polishing allows for a controlled, layer by layer removal of a desired material from the wafer surface, resulting in a preferential removal of protruding surface topography and a planarized wafer surface.

Chemical mechanical polishing (CMP), also referred to in the art as chemical mechanical planarization (CMP), involves holding or rotating a wafer of semiconductor material against a wetted polishing surface under controlled chemical slurry, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. Such apparatus for polishing semiconductor wafers are disclosed in U.S. Pat. Nos. 4,193,226 and 4,811,522. Another such apparatus is manufactured by Westech Engineering and is designated as a Model 372 Polisher.

In a typical CMP process, a wafer is pressed against a polishing pad in the presence of a slurry under controlled chemical, pressure, velocity, and temperature conditions. The slurry solution generally contains small, abrasive particles that abrade the surface of the wafer, and chemicals that etch and/or oxidize the surface of the wafer. The polishing pad is generally a planar pad made from a continuous phase matrix material such as polyurethane. Thus, when the pad and/or the wafer moves with respect to the other, material is removed from the surface of the wafer by the abrasive particles (mechanical removal) and by the chemicals (chemical removal) in the slurry.

FIG. 1 schematically illustrates a conventional CMP machine 10 with a platen 20, a wafer carrier 30, a polishing pad 40, and a slurry 44 on the polishing pad. An under-pad 25 is typically attached to the upper surface 22 of the platen 20, and the polishing pad 40 is positioned on the under-pad 25. In the conventional CMP machines, a drive assembly 26 rotates the platen 20 in a direction indicated by arrow A. However, alternatively the drive assembly 26 may also reciprocate the platen 20 back and forth in the direction indicated by arrow B. The motion of the platen 20 is imparted to the pad 40 through the under-pad 25 because the polishing pad 40 frictionally engages the under-pad 25. The wafer carrier 30 has a lower surface 32 to which a wafer 12 may be attached, or the wafer 12 may be attached to a resilient pad 34 positioned between the wafer 12 and the lower surface 32. The wafer carrier 30 may be a weighted, free floating wafer carrier, but an actuator assembly 36 is preferably attached to the wafer carrier 30 to impart axial and rotational motion, as indicated by arrows C and D, respectively.

In the operation of the conventional CMP machine 10, the wafer 12 faces downward against the polishing pad 40, and then the platen 20 and the wafer carrier 30 move relative to one another. As the face of the wafer 12 moves across the planarizing surface 42 of the polishing pad 40, the polishing pad 40 and the slurry 44 remove material from the wafer 12. CMP processes typically remove either conductive materials or insulative materials from the surface of the wafer to produce a flat, uniform surface upon which additional layers of devices may be fabricated.

However, conventional CMP creates micro scratches on the surface of the layer being polished. These micro scratches are particularly problematic in interconnection schemes. For example, the scratches formed during CMP are filled with metal as the metal layer is deposited. As dimensions of feature size becomes increasingly smaller, there is a greater probability that a scratch contacting adjacent metal lines may exist. The metal trapped in such a scratch creates a short between the adjacent metal lines with which it is in contact, thus rendering the device defective.

Therefore, there exist a need to provide a CMP method that reduces defects causes by scratching and increases the speed of the CMP process.

SUMMARY OF THE INVENTION

The present invention provides a method of fabrication of an integrated circuit, the method including altering a portion of a surface layer of a material to be polished and polishing the surface layer in a chemical mechanical polishing process. Preferably, the step of altering of the present invention includes adding an impurity to the material such as a dopant to the material layer.

The above and other advantages and features of the invention will be more clearly understood from the following detailed description which is provided in connection with the accompanying drawings.

DETAILED DESCRIPTION OF THE PREFERRED EMBODIMENTS

Figure 1:
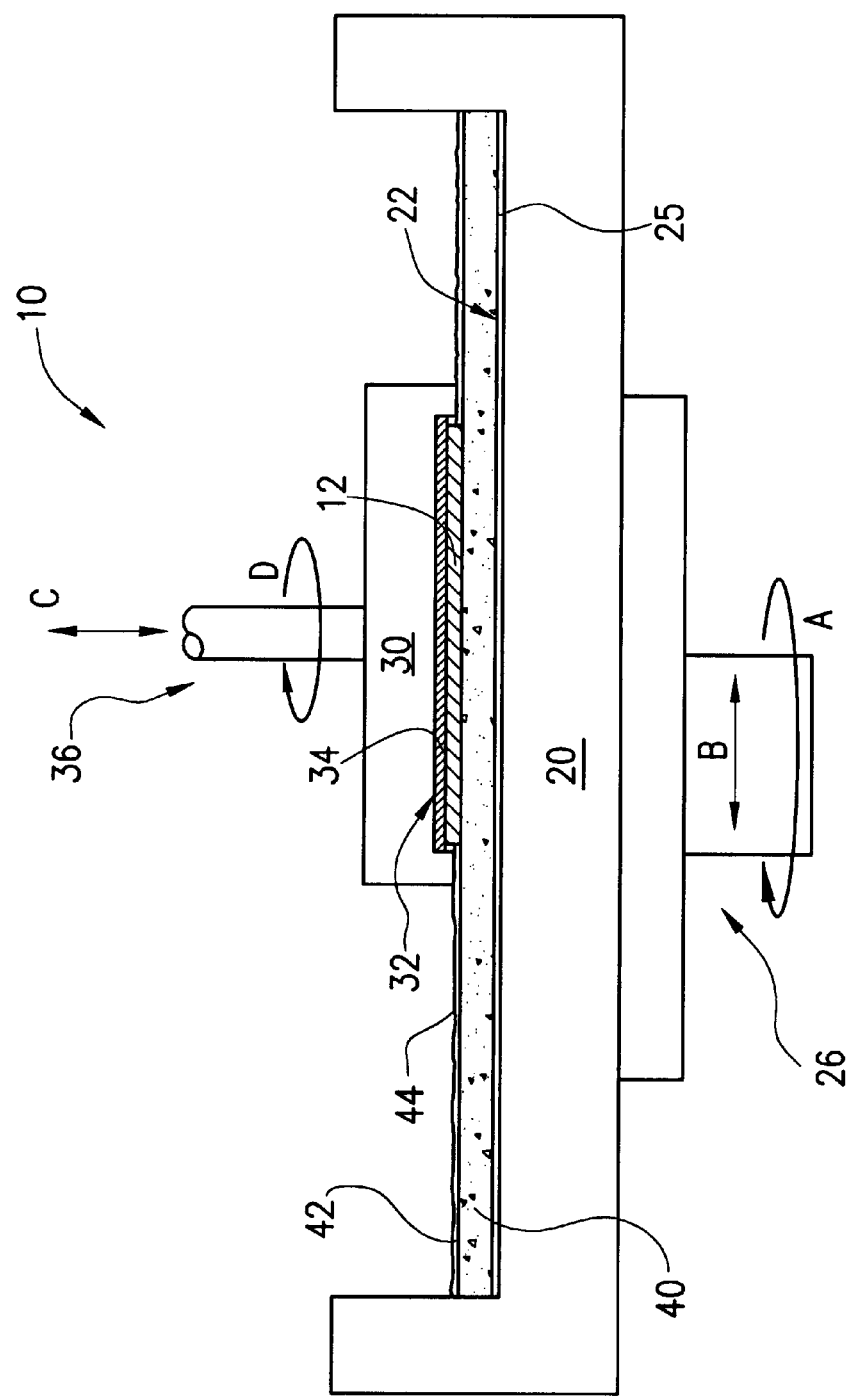
FIG. 1 is a schematic cross-sectional view of a conventional CMP apparatus.

In the following detailed description, reference is made to the accompanying drawings which form a part hereof, and in which is shown by way of illustration specific embodiments in which the invention may be practiced. It should be understood that like reference numerals represent like elements. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The following detailed description is, therefore, not to be taken in a limiting sense, and the scope of the present invention is defined by the appended claims.

Semiconductor materials are made conductive by adding impurities to them, which is commonly referred to as "doping". If the material is doped with an element such as boron which has one less valence electron than the semiconductive material, electron "holes" become the dominant charge carrier and the doped material is referred to as P-type. If the doping is with an element such as phosphorus, which has one more valence electron than silicon, additional electrons become the dominant charge carriers and the doped material is referred to as N-type. While improving the conductivity of the material, doping also damages the surface of the substrate. Furthermore, the polishing rate of a doped surface is much higher that the polishing rate of the undoped surface. Thus, the doped surface is polished faster with a smooth flat surface and with less scratches than an undoped surface. The present method may be used to CMP any surface in semiconductor processing where a planar surface is desired, such as, for example, shallow trench isolation, interlayer dielectrics, passivation layers, polysilicon layers and the like.

Figure 2:
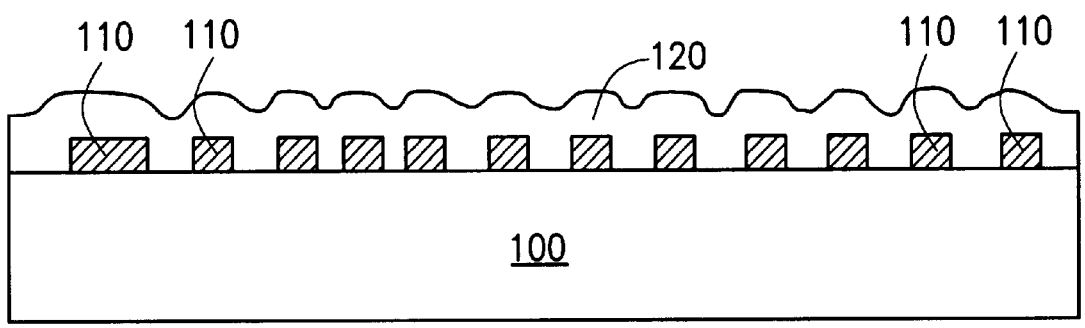
FIG. 2 is a schematic cross-sectional view of portion of a semiconductor wafer at an intermediate stage of processing according to a first embodiment of the present invention.

Reference is now made to FIG. 2. A substrate 100 is shown at an intermediate stage of processing. Substrate 100 has semiconductor devices 110 formed thereon. It should be understood that devices 110 are complicated semiconductor devices, which may include CMOS transistors, resistors, diodes, capacitors that are formed in and on substrate 100 by patterning and layering techniques known in the art. These devices are complicated structures that are depicted as shown in FIG. 2 for simplicity. A passivation layer 120 is formed over semiconductor devices 110 and substrate 100 as shown in FIG. 2. The passivation layer may be any conventional doped or undoped layer known in the art, such as silicon dioxide, TEOS, doped or undoped silicon or the like.

Figure 3:
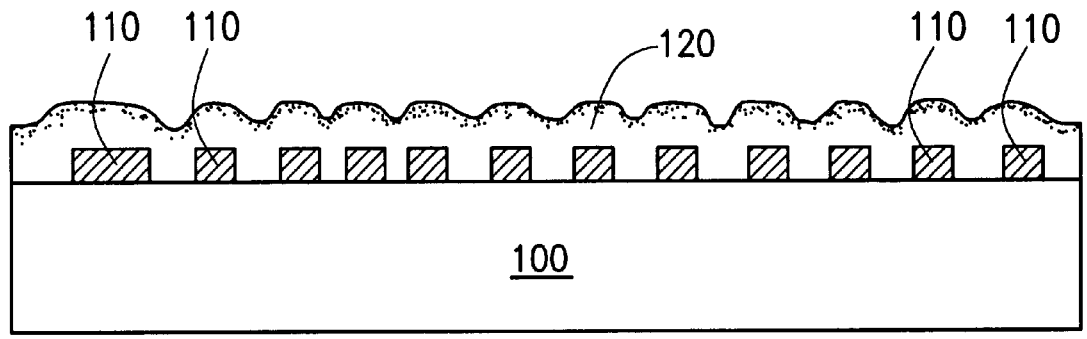
FIG. 3 is a schematic cross-sectional view of portion of a semiconductor wafer at an intermediate stage of processing subsequent to that of FIG. 2.

Reference is made to FIG. 3. Passivation layer 120 is doped with a heavy dopant implant by conventional methods, preferably by ion implantation. The dopants are implanted into layer 120 at a dopant concentration of from about $1 \times 10^{10}$ ions/cm$^2$ to about $1 \times 10^{18}$ ions/cm$^2$. Layer 120 may be doped with any suitable dopant containing materials, for example, materials containing one or more of phosphorous, boron, argon, arsenic, oxygen, fluorine or chlorine may be used. In a preferred embodiment, the dopant is phosphorous, boron, argon or arsenic.

The layer 120 is preferably doped with the dopant by ion implantation at a power of from about 1 KeV to about 3 MeV. It should be understood that the dopant concentration and power will vary depending upon a variety of physical parameters such as, for example, the material being implanted, the processing stage of the semiconductor substrate, the amount of material to be removed and other factors.

Figure 4:
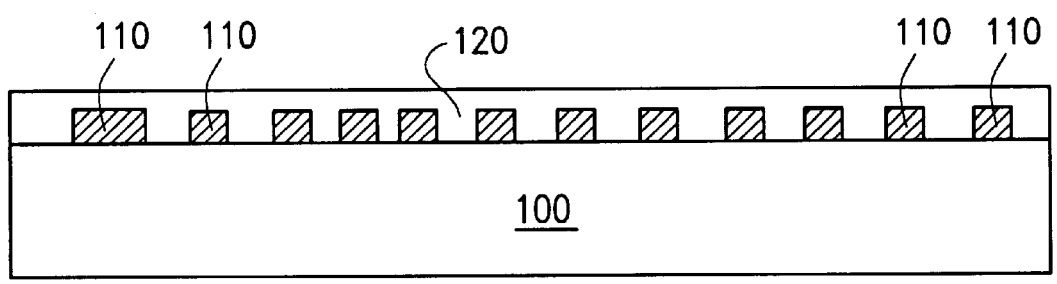
FIG. 4 is a schematic cross-sectional view of portion of a semiconductor wafer at an intermediate stage of processing subsequent to that of FIG. 3.

After doping of layer 120, a portion of layer 120 damaged by the doping process is removed by a chemical mechanical polishing process (CMP) which includes mechanically polishing layer 120 in a slurry which may include, for example, the combination of two or three ingredients including: 1) a chemical base such as hydrogen peroxide ($H_2 O_2$), $NH_4OH$, or KOH dissolved in water; 2) an abrasive, such as alumina, silica, or titanium oxide ($TiO_x$ where x equals 1 to 2); and 3) an optional fluid, such as ethylene glycol in which the abrasive is suspended. The CMP process removes portions of layer 120 at a rate of from about 500 Å/min. to about 10,000 Å/min to arrive at the structure shown in FIG. 4. As can be seen from the figure, the surface of layer 120 after CMP is smooth and planar.

Figure 5:
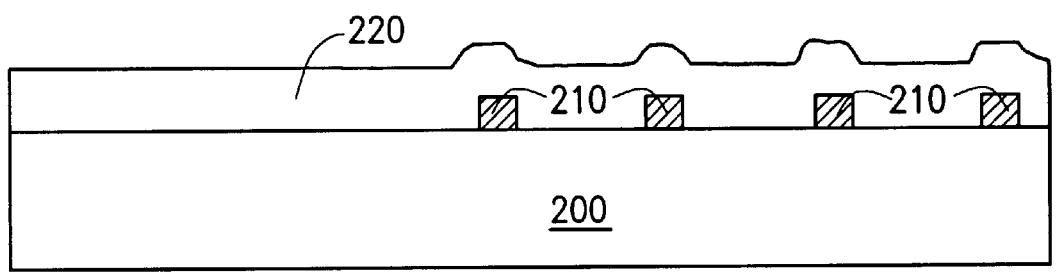
FIG. 5 is a schematic cross-sectional view of portion of a semiconductor wafer at an intermediate stage of processing according to a second embodiment of the present invention.

Reference is now made to FIG. 5 which depicts a second embodiment of the present invention. A substrate 200 is shown at an intermediate stage of processing. Substrate 200 has semiconductor devices 210 formed thereon. It should be understood that devices 210 are complicated semiconductor devices, which may include CMOS transistors, resistors, diodes, capacitors that are formed in and on substrate 200 by patterning and layering techniques known in the art. These devices are complicated structures that are depicted as shown in FIG. 5 for simplicity. A passivation layer 220 is formed over semiconductor devices 210 and substrate 200 as shown in FIG. 5. As set forth above, the passivation layer may be any conventional doped or undoped layer known in the art, such as silicon dioxide, TEOS, doped or undoped silicon or the like.

Figure 6:
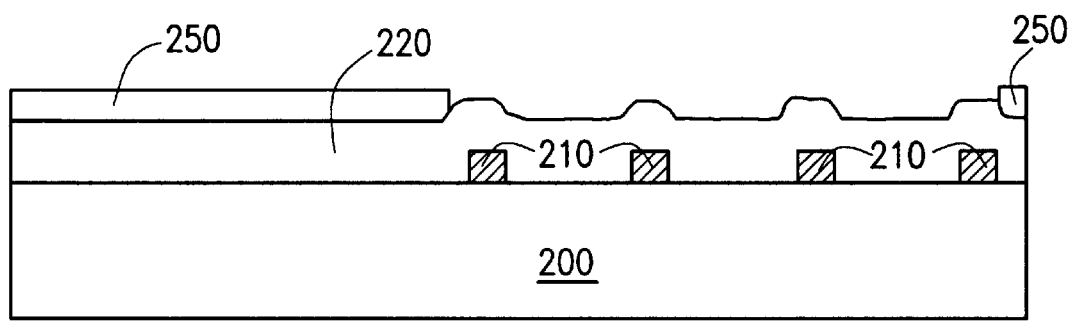
FIG. 6 is a schematic cross-sectional view of portion of a semiconductor wafer at an intermediate stage of processing subsequent to that of FIG. 5.
Figure 7:
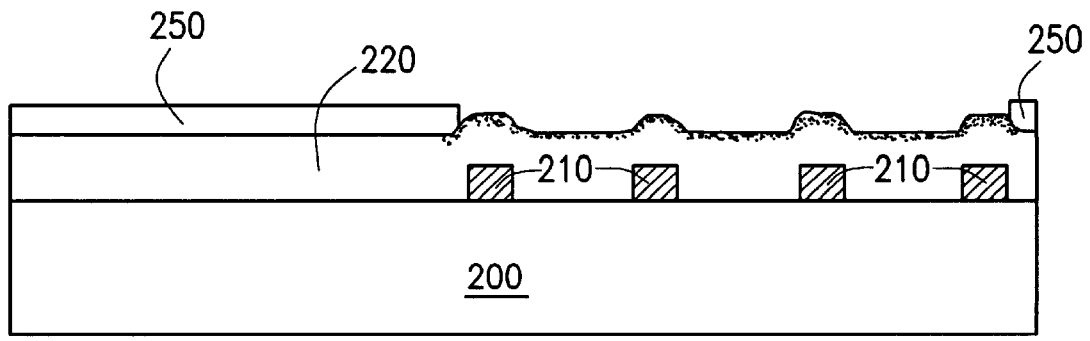
FIG. 7 is a schematic cross-sectional view of portion of a semiconductor wafer at an intermediate stage of processing subsequent to that of FIG. 6.

Reference is made to FIG. 6. A mask 250 is patterned and deposited over passivation layer 220 as shown. Passivation layer 220 is doped with a heavy dopant implant by conventional methods, preferably by ion implantation and mask 250 is removed to arrive at the substrate illustrated in FIG. 7. The dopants are implanted into layer 220 at a dopant concentration of from about $1 \times 10^{10}$ ions/cm$^2$ to about $1 \times 10^{18}$ ions/cm$^2$. Layer 220 may be doped with any suitable dopant containing materials, for example, materials containing one or more of phosphorous, boron, argon, arsenic, oxygen, fluorine or chlorine. In a preferred embodiment, the dopant is phosphorous, boron, argon or arsenic.

The layer 220 is doped preferably doped with the dopant by ion implantation at a power of from about 1 KeV to about 3 MeV. It should be understood that the dopant concentration and power will vary depending upon a variety of physical parameters such as, for example, the material being implanted, the processing stage of the semiconductor substrate, the amount of material to be removed and other factors.

Figure 8:
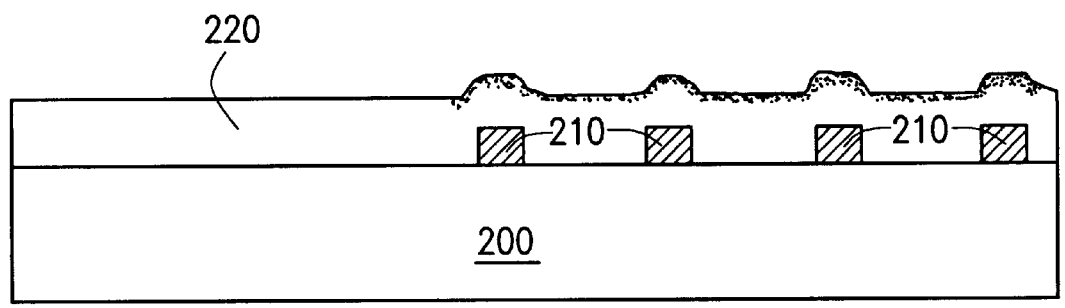
FIG. 8 is a schematic cross-sectional view of portion of a semiconductor wafer at an intermediate stage of processing subsequent to that of FIG. 7.

After doping of layer 220, a first portion of layer 220 damaged by the doping process is removed by a chemical mechanical polishing process (CMP) which includes mechanically polishing layer 220 in a slurry which may include, for example, the combination of two or three ingredients including: 1) a chemical base such as hydrogen peroxide ($H_2O_2$), $NH_4OH$, or KOH dissolved in water; 2) an abrasive, such as alumina, silica, or titanium oxide ($TiO_x$ where x equals 1 to 2); and 3) an optional fluid, such as ethylene glycol in which the abrasive is suspended. FIG. 8 illustrates the process at an intermediate stage of polishing.

Figure 9:
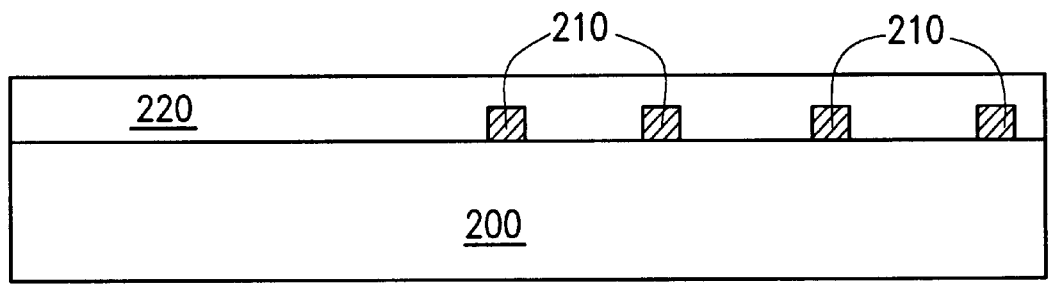
FIG. 9 is a schematic cross-sectional view of a portion of a semiconductor wafer at an intermediate stage of processing subsequent to that of FIG. 8.

The CMP process removes portions of layer 220 at a rate of from about 500 Å/min. to about 10,000 Å/min to arrive at the structure shown in FIG. 9. As can be seen from the figure, the surface of layer 220 after CMP is smooth and planar.

The following example, which constitutes the best mode presently contemplated by the inventor for practicing the present invention, is presented solely for the purpose of further illustrating and disclosing the present invention, and is not to be construed as a limitation on, the invention:

EXAMPLE

Figure 10A:
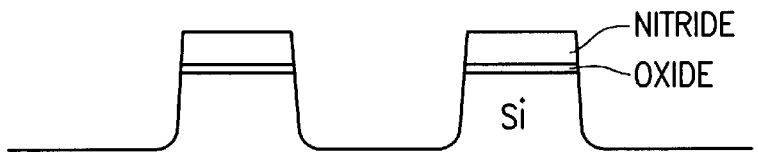
FIGS. 10A through 10D are schematic cross sectional views of a portion of a semiconductor wafer at an intermediate stage of processing and showing an example of use of the invention in forming shallow trench isolation regions.
Figure 10B:
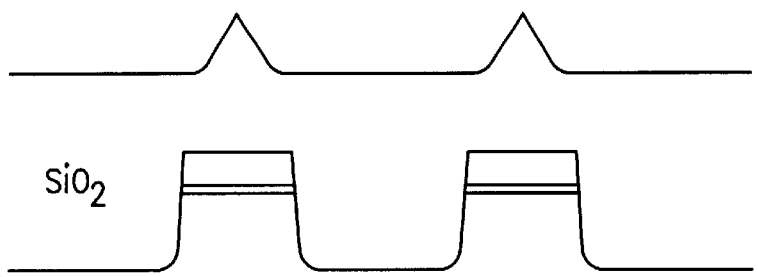
Figure 10C:
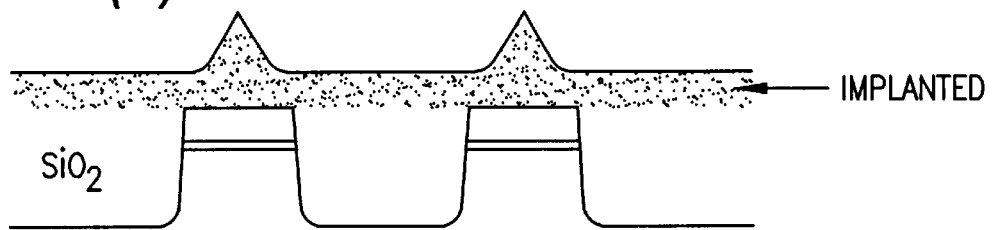
Figure 10D:
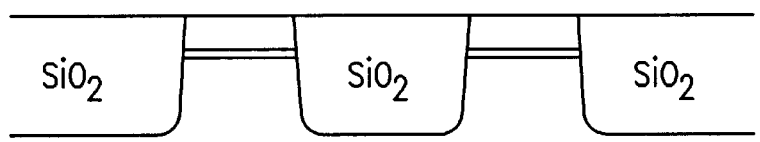

A specific exemplary use of the invention is in the formation of shallow trench isolations regions is shown in FIGS. 10A through 10D. A wafer has deposited thereon a layer of oxide, e.g. silicon dioxide, and a layer of nitride. After a trench is defined, as shown in FIG. 10B, the wafer has a layer of silicon dioxide deposited thereon, as shown in FIG. 10B. The silicon dioxide layer is then implanted with phosphorus with a dopant concentration of from about $1\times10^{15}$ ions/cm$^2$ to about $1\times10^{17}$ ions/cm$^2$ by ion implantation at an energy of about 10 to 100 KeV, shown in FIG. 10c. The doped surface layer of the silicon dioxide layer is then CMP processed, as shown in FIG. 10d. The doped silicon dioxide layer can be removed faster and with less defects than comparable non-doped surfaces. The dosage and energy for the implant can be optimized to achieve the best process conditions. Other dopants as discussed above can also be used.

The above description and accompanying drawings are only illustrative of preferred embodiments which can achieve the features and advantages of the present invention. It is not intended that the invention be limited to the embodiments shown and described in detail herein. Accordingly, the invention is not limited by the forgoing descriptions, but is only limited by the scope of the following claims.

What is claimed as new and desired to be protected by Letters Patent of the United States is:

1. A method of fabrication of an integrated circuit, said method comprising the steps of:
providing a semiconductor wafer having a surface layer of a material to be planarized in a chemical polishing process;
altering a portion of said surface layer of material to damage said surface layer by implanting said surface layer with a material selected from the group consisting of argon, arsenic, oxygen, fluorine and chlorine; and
polishing said altered surface layer in said chemical mechanical polishing process.

2. The method according to claim 1, wherein said material is argon.

3. The method according to claim 1, wherein said material is arsenic.

4. The method according to claim 1, wherein said material is implanted by ion implantation.

5. The method according to claim 1, wherein said material is implanted into said surface layer at a concentration of from about $1\times10^9$ ions/cm$^2$ to about $1\times10^{18}$ ions/cm$^2$.

6. The method according to claim 1, wherein said material is implanted at an energy of from about 1 KeV to about 3 MeV.

7. The method according to claim 6, wherein said surface layer is polished at a rate of from about 500 Å/min. to about 10,000 Å/min.

8. The method according to claim 1, wherein said surface layer is polished at a rate of from about 500 Å/min. to about 10,000 Å/min.

9. The method according to claim 1, wherein said surface layer of material is a silicon layer.

10. The method according to claim 1, wherein said surface layer of material is a TEOS layer.

11. The method according to claim 1, wherein said surface layer of material is a BPSG layer.

12. The method according to claim 1, wherein said surface layer of material is at a shallow trench isolation area.

13. The method of claim 12 wherein said layer of material is a silicon dioxide.

14. The method of claim 1, wherein said material is fluorine.

15. The method of claim 1, wherein said material is oxygen.

16. The method of claim 1, wherein said material is chlorine.

17. A method of fabrication of an integrated circuit, said method comprising the steps of:
providing a semiconductor wafer having a surface layer of a material to be planarized in a chemical mechanical polishing process;
masking at least a portion of said surface layer of material;
altering said unmasked portion of said surface layer of material to damage said surface layer by implanting said surface layer with a material selected from the group consisting of argon, arsenic, oxygen, fluorine and chlorine;
removing said mask; and
polishing said roughened surface layer in said chemical mechanical polishing process.

18. The method according to claim 17, wherein said material is argon.

19. The method according to claim 17, wherein said material is arsenic.

20. The method according to claim 17, wherein said material is implanted by ion implantation.

21. The method according to claim 17, wherein said material is implanted into said surface layer at a concentration of from about $1\times10^9$ ions/cm$^2$ to about $1\times10^{18}$ ions/cm$^2$.

22. The method according to claim 17, wherein said material is implanted at an energy of from about 1 KeV to about 3 MeV.

23. The method according to claim 22, wherein said surface is polished at a rate of from about 500 Å/min. to about 10,000 Å/min.

24. The method according to claim 17, wherein said surface is polished at a rate of from about 500 Å/min. to about 10,000 Å/min.

25. The method according to claim 17, wherein said surface layer of material is a silicon layer.

26. The method according to claim 17, wherein said surface layer of material is a TEOS layer.

27. The method according to claim 17, wherein said surface layer of material is a BPSG layer.

28. The method according to claim 17, wherein said surface layer is an interlayer dielectric.

29. The method according to claim 17, wherein said surface layer of material is a shallow trench isolation area.

30. The method according to claim 17, wherein said unmasked portion of said surface layer includes a shallow trench isolation area.

31. The method as in claim 30 wherein said shallow trench isolation area includes a layer of silicon dioxide.

32. The method of claim 17, wherein said material is fluorine.

33. The method of claim 17, wherein said material is oxygen.

34. The method of claim 17, wherein said material is chlorine.

* * * * *